United States Patent [19]

Koch et al.

[11] Patent Number: 5,663,824
[45] Date of Patent: Sep. 2, 1997

[54] OPTICAL MODULATORS AS MONOLITHICALLY INTEGRATED OPTICAL ISOLATORS

[75] Inventors: Thomas L. Koch, Holmdel, N.J.; Fumio Koyama, Sagamihara, Japan; Kang-Yih Liou, Holmdel, N.J.

[73] Assignee: Lucent Technologies Inc., Murray Hill, N.J.

[21] Appl. No.: 146,653

[22] Filed: Nov. 2, 1993

[51] Int. Cl.$^6$ ........................................... H04B 10/04
[52] U.S. Cl. ..................... 359/184; 359/163; 359/180; 385/14
[58] Field of Search ..................... 359/180, 181, 359/184, 259, 113, 143, 152, 154, 163; 385/14; 250/551; 455/102

[56] References Cited

U.S. PATENT DOCUMENTS

| | | | |
|---|---|---|---|
| 4,789,843 | 12/1988 | Hicks | 332/757 |
| 4,866,698 | 9/1989 | Huggins et al. | 359/181 |
| 5,020,154 | 5/1991 | Zierhut | 359/154 |
| 5,113,278 | 5/1992 | Degura et al. | 359/181 |

FOREIGN PATENT DOCUMENTS

| | | |
|---|---|---|
| 0556974 | 8/1993 | European Pat. Off. . |
| 0566974 | 8/1993 | European Pat. Off. . |
| 0064418 | 3/1988 | Japan ..................... 359/181 |
| 0071337 | 3/1989 | Japan ..................... 359/184 |
| WO890566 | 6/1989 | WIPO . |

OTHER PUBLICATIONS

Taga et al., "Bit Error Rate Measurement & 2–5 Gbit/s Data Modulated Solitons Generated by InGaAsP EA Modulator Using A Circulating Loop" Electronics Letters, vol. 28, No. 13, Jun. 1992, pp. 1280–1281.

Noda et al., "High–Speed Electroabsorption Modulator with Strip–Loaded GaInAsP Planar Waveguide", *J. Lightwave Tech.*, vol. LT–4, pp. 1445–1453 (1986).

Soda et al., "High–Speed GaInAsP/InP Buried–Heterostructure Optical Intensity Modulator with Semi–Insulating InP Burying Layers", *Electronics Letters*, vol. 23, No. 23, pp. 1232–1234 (1987).

T.H. Wood, "Multiple Quantum Well (MQW) Waveguide Modulators", *IEEE J. Lightwave Technology*, vol. 6, No. 6, pp. 743–757 1988.

Wakita et al., "High–Speed Long Wavelength Optical Modulation in InGaAs/InAlAs Multiple Quantum Wells", *Electronics Letters*, vol. 21, No. 21, pp. 951–952 (1985).

Soda et al., "High–Power Semi–Insulating BH Structure Monolithic Electro–Absorption Modulator/DFB Laser Light Source Operating at 10 Gb/s"; IOOC '89, 20PDB–5, (1989).

Suzuki et al., "Monolithic Integration of InGaAs/InP Distributed Feedback Laser and Electroabsorption Modulator by Vapor Phase Epitaxy", *IEEE J. Lightwave Technology*, vol. LT–5, No. 9, pp. 1279–1285 (1987).

Aoki et al., "Novel Structure MQW Electroabsorption Modulator/DFB–Laser Integrated Device Fabricated by Selective Area MOCVD Growth", *Electronics Letters*, vol. 27, No. 23, pp. 2138–2140 (1991).

Kato et al., "Novel MQW DFB Laser Diode/Modulator Integrated Light Source Using Bandgap Energy Control Expitaxial Growth Technique", *Technology Digest*, ECOC '91, Paper WeB7–1 (1991).

(List continued on next page.)

*Primary Examiner*—Kinfe-Michael Negash

[57] ABSTRACT

An apparatus and technique for providing isolation for a signal source utilizing two or more modulators is described. In particular, the apparatus generates a timed sequence of "open gates" that are synchronized to the data signal which permit transmission in a forward direction, and which attenuate a reverse direction signal. Another embodiment attenuates primarily reflected light signals by utilizing a passive waveguide and a modulator. The passive waveguide provides a propagation delay such that signals reflected from its end facet are attenuated by the modulator. The apparatus is suitable for use as an isolator for a light source in a high-speed optical fiber data transmission system.

33 Claims, 5 Drawing Sheets

OTHER PUBLICATIONS

Koyama et al., "Frequency Chirping in External Modulators", *IEEE J. Lightwave Technology*, vol. 6, No. 1, pp. 87–92 (1988).

Suzuki et al., "Application of a /4–Shifted DFB Laser/Electroabsorption Modulator Monolithically Integrated Light Source to Single–Chip Pulse Generator with Variable Repetition Rate", *IEEE Photonics, Technology Letters*, vol. 4, No. 10, pp. 1129–1132 (1992).

C.H. Henry, "Theory of the Linewidth of Semiconductor Lasers", *IEEE J. Quantum Electronics*, vol. Qe–18, No. 2, pp. 259–264 (1982).

Applied Physics Letters, vol. 32, No. 5, pp. 314–316.

OPTICAL MODULATORS AS MONOLITHICALLY INTEGRATED OPTICAL ISOLATORS

TECHNICAL FIELD

This invention relates generally to a method and apparatus for use in high-speed optical fiber data transmission systems. More particularly, the present invention relates to a configuration of modulators for providing a timed sequence of optical gates that allow data pulse transmission in a forward direction and attenuate all signals travelling in the reverse direction. The device can therefore function as an optical isolator, and is suitable for monolithic integration with other semiconductor components in an optical data transmission system.

BACKGROUND OF THE INVENTION

When several optical components are connected in tandem, an optical isolator is usually required to suppress instability of the optical source. Such instability may be caused by light reflected back into the optical source by a neighboring component, or by light originating from a different source that impinges on the optical source.

Prior art optical isolators typically rely on the non-reciprocal nature of magnetic media to achieve isolation. These current devices rely on a polarization rotation or non-reciprocal beam deflection, and with time invariant systems this non-reciprocal behavior is required by definition. Other approaches, such as using a linear polarizer in conjunction with polarization components that function as quarter-wave plates, require that the reflection being isolated against is a non-polarization-changing reflection. Therefore, if the reflected signal is in an arbitrary polarization state, the reciprocal isolation means discussed above are inadequate. Further, interfering light from a different source may have an arbitrary polarization state. Thus, any time-invariant reciprocal means cannot in general provide isolation.

It is known that directly modulated semiconductor laser sources suffer from frequency chirp problems due to the inherent fluctuations of the complex index of refraction that are used to induce the modulation. Semiconductor electro-absorption modulators using bulk or quantum well structures have been developed to mitigate such frequency chirp problems, and monolithically integrated devices comprising electroabsorption modulators and distributed feedback lasers (DFB lasers) or distributed Bragg reflector lasers (DBR lasers) have been demonstrated See, for example, Y. Noda et al., "High-Speed Electroabsorption Modulator with Strip-Loaded GaInAsP Planar Waveguide", *IEEE J. Lightwave Tech.*, Vol. LT-4, pages 1445–53 (1986), and M. Suzuki et al., "Monolithic Integration of InGaAs/InP Distributed Feedback Laser and Electroabsorption Modulator by Vapor Phase Epitaxy", *IEEE J. Lightwave Tech.*, Vol. LT-5, pages 1279–85 (1987). For very high bit rate systems of 10 Gigabits per second or higher, however, even the small amount of frequency chirp exhibited by a monolithically integrated laser and electroabsorption modulator device can degrade system performance. A significant component of the chirp in such a device can result from undesirable reflections from the modulator output facet. In addition, reflections from adjoining components may cause system degradation when an external modulator is used to encode the unmodulated output of a laser source for high-speed, long distance optical fiber data transmission.

Although the monolithic integration of optical devices on the same semiconductor substrate has many advantages including reduced connection losses, increased reliability, lower cost and lower power consumption, due to the reciprocal properties of semiconductor materials and the requirements for isolation outlined above, it has not previously been possible to effectively integrate optical isolators and light sources. Consequently, both reflections from adjoining components and light originating from other sources may degrade the overall performance of the light source.

SUMMARY OF THE INVENTION

It is an object of the present invention to provide a method and apparatus resulting in an optical isolator that is suitable for use with semiconductor light sources. The optical isolator can be monolithically integrated with an optical source resulting in a device having reduced frequency chirp characteristics, suitable for high-speed optical fiber data transmission.

It is a further object of the present invention to protect against light interference from other sources and from any reflections of the transmitted signal.

One embodiment of the invention comprises at least two modulators arranged sequentially in a line through which signals from a signal source propagate. The modulators are arranged to have a spatial separation chosen to realize a sequence of timed "open gates" that are synchronous with the traveling wave of a return-to-zero (RZ) bitstream of data from the source. The term "open gate" is defined as the function of a modulator whereby it is in a transmissive state, and the term "closed gate" is its attenuating state. In particular, each modulator in the sequence is driven to have a period identical to that of the RZ pulse stream, and the phase of the drive to each modulator is chosen so that a modulator offers an open gate delayed in time from the preceding modulator's open gate by the propagation delay between the modulators. The timing of the open gates coincides with the bit period of the emitted RZ pulse stream, such that data is transmitted without attenuation in the forward direction. Further, the timing of open gates is such that a signal traveling in the reverse direction will encounter at least one modulator that is in its off state, presenting a closed gate. The degree of attenuation of such a signal depends upon the extinction ratio of the modulator. Therefore, isolation is provided from any signal traveling in the reverse direction, including reflections and signals from other sources in the system. The device is suitable for use as an optical isolator for a semiconductor light source, and further may be monolithically integrated with the light source.

Another embodiment according to the present invention comprises a sequentially arranged modulator and a passive waveguide for connection to a signal source. The passive waveguide provides a propagation delay for any signal reflected by the end facet of the waveguide, such that the modulator attenuates the reflected signal before it impinges on the source. This configuration substantially reduces frequency chirp for an optical transmission system, and can be monolithically integrated with a light source. Although this embodiment provides isolation only from the end facet reflections, in some circumstances this is the most troublesome signal to isolate against. Thus, this configuration may be the simplest, smallest, and most cost effective isolator embodiment.

DETAILED DESCRIPTION

Figure 1:
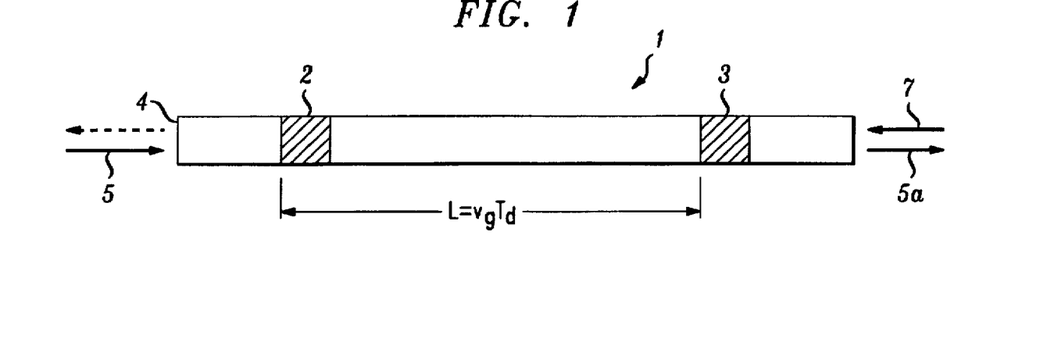
FIG. 1 is a simplified block diagram of two modulators positioned to operate as an isolator according to the present invention.

FIG. 1 is a simplified block diagram of an isolator 1 according to one embodiment of the invention. Although the present invention is described herein in the context of optical data transmission systems, it should be understood that the apparatus and technique can be applied to other transmission systems.

Referring to FIG. 1, a first modulator 2 is sequentially arranged with a second modulator 3 so as to be separated by a distance L. For the purposes of this application, a modulator is defined as any device capable of altering the intensity or amplitude of a signal. One end 4 of the isolator 1 can be attached to a signal source (not shown), such as an optical source. Isolator 1 permits a transmitted signal 5 to propagate through the modulators 2, 3 without being attenuated, as shown by arrow 5a. A reverse direction signal 7 is attenuated by the isolator 1 before it can impinge on the source, thus preventing transmission system degradation due to interference from other sources and from signal reflections.

Figure 2:
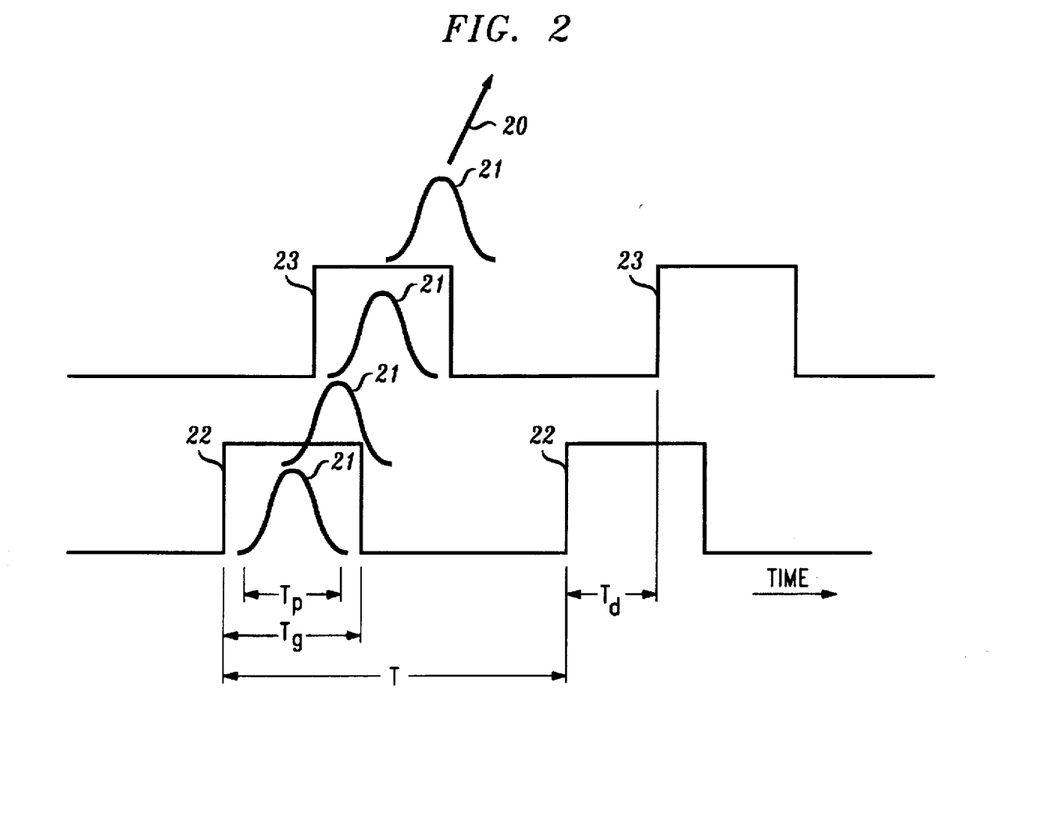
FIGS. 2 and 3 are timing diagrams illustrating the operation of the apparatus of FIG. 1.
Figure 3:
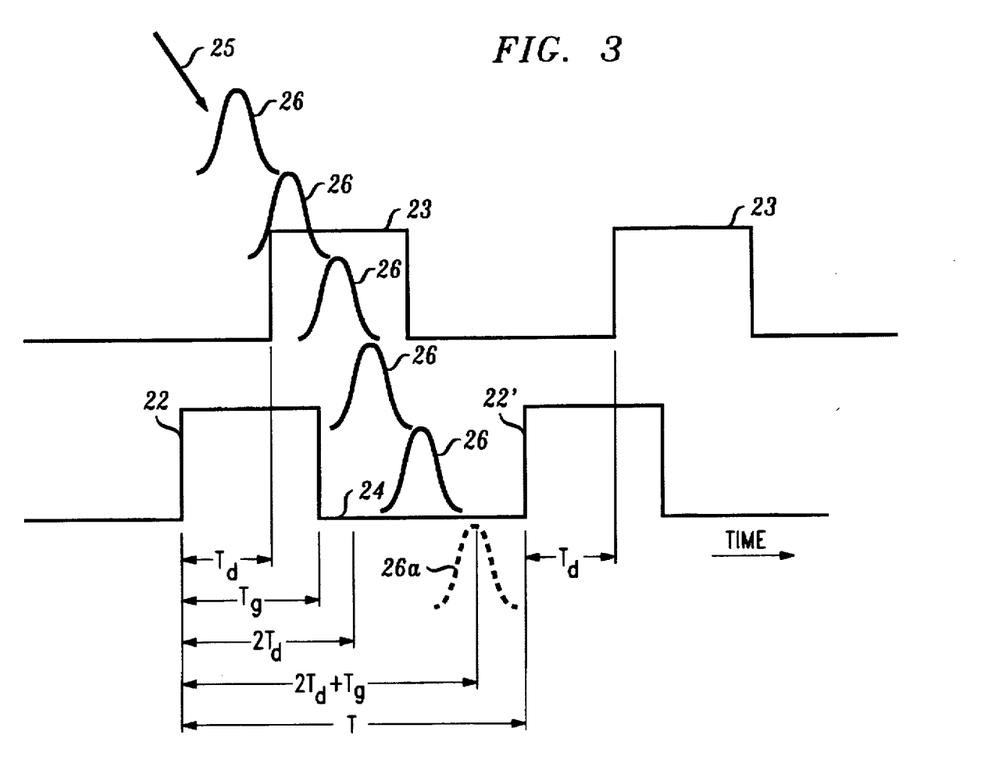

FIGS. 2 and 3 are timing diagrams which respectively illustrate forward direction transmission of a data signal 21 through the isolator 1 of FIG. 1, and attenuation of a reverse direction signal 26. It should be understood that FIGS. 2 and 3 are not drawn to scale, and are presented in this manner to facilitate understanding of the invention. It should further be understood that the transmission and attenuation operations shown separately in FIGS. 2 and 3 can occur simultaneously.

In the discussion of FIGS. 2 and 3, it is assumed that the isolator 1 of FIG. 1 is connected to an optical source (not shown) which transmits a Return-to-Zero (RZ) modulated data bit stream having a period T with a data bit rate of B=1/T. Referring to FIG. 2, a data pulse 21 is shown travelling with a group velocity $v_g$ in a forward direction 20 through "open gates" 22, 23 generated by each of the two modulators 2, 3. The term "open gate" is used here to refer to the function of a modulator whereby it is in an open, transmissive state, and the term "closed gate" is its attenuating or blocking state.

Referring to FIGS. 1 and 2, the first modulator 2 is driven to provide a first series of open gates 22 of duration $T_g$, and the second modulator 3 is driven to provide a second series of open gates 23 of duration $T_g$. The open gates 22, 23 are synchronous with the RZ modulated data bit stream generated by the source. The RZ data stream pulses are of duration $T_p$, which is less than one-half of the period of the data bit stream. $T_p < T/2$. Each of the open gates 22, 23 has a duration $T_g$ that is longer than the duration $T_p$ of a data stream pulse 21, and does not exceed one-half of the bit period. Thus, $T_p \leq T_g \leq T/2$. In addition, the modulators are arranged to have a spatial separation of $L=v_g T_d$, as shown in FIG. 1, so that a time delay of $T_d$ exists between them with respect to the arrival time of a pulse at each modulator.

FIG. 3 depicts the same set of generated gates shown in FIG. 2, however, a signal 26 travelling in a reverse direction 25 is shown being attenuated by the isolator 1 of FIG. 1. The signal 26 is shown propagating freely through the middle of the open gate 23 of the second modulator 3. As the signal 26 continues in the direction 25, it encounters the closed gate 24 of the first modulator and is attenuated. This attenuated pulse is depicted as dotted line 26a. The degree of attenuation of a reverse direction signal is a function of the extinction ratio of the modulators. Thus, the degree of isolation provided by an isolator according to the present invention depends upon the type of modulators utilized.

Referring to FIG. 3, in order to assure that all reverse direction signals are attenuated, the timing of the open gates 22, 23 must be such that the first modulator's open gate 22 must close before any reverse direction signal making its way through the beginning of the second modulator's open gate 23 reaches the first modulator. Thus, it is required that $2T_d \geq T_g$. This condition guarantees that such a signal will be attenuated by a closed gate of the first modulator. In addition, the first modulator cannot have its next open gate 22' for the next cycle until after any reverse direction signal 26 passing through the tail end of the second modulator's open gate 23 is attenuated. This requires that twice the delay $T_d$ plus the duration of an open gate $T_g$ be equal to or less than the period of the data signal, or $2T_d + T_g \leq T$. Thus, if the delay $T_d$ between open gates 22, 23 satisfies the expressions $T_d \geq T_g/2$ and $T_d \leq (T-T_g)/2$, then data pulses 21 will be transmitted without attenuation in the forward direction 20, while all reverse direction signals 26 will be attenuated.

The two conditions $T_d \geq T_g/2$ and $T_d \leq (T-T_g)/2$ arise from the requirement that no signal can get through in the reverse direction. If both conditions are not met, then part or all of a reverse direction signal could make its way through the modulators and impinge upon the source. In high speed fiber optic data transmission systems, such interference is undesirable. For example, it could cause frequency chirp problems which can degrade system performance.

Figure 4:
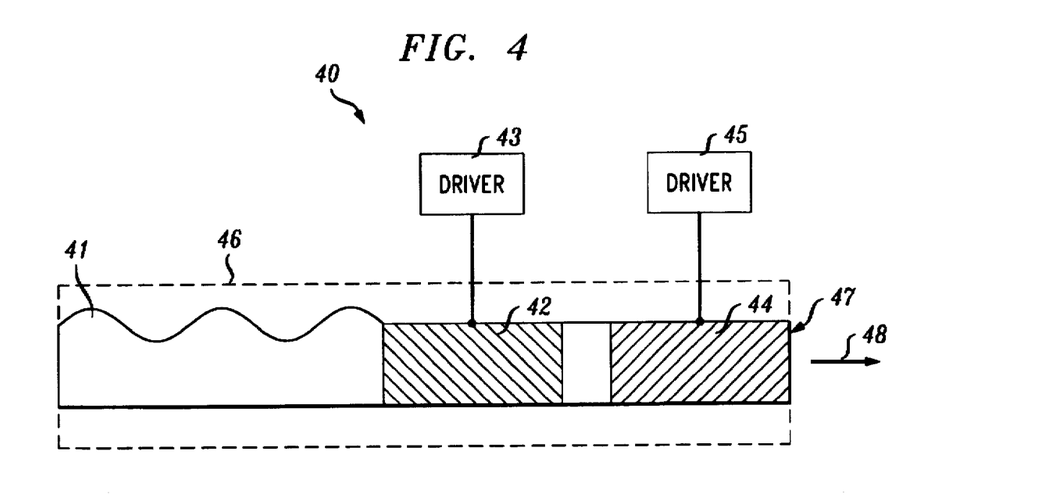
FIG. 4 is a simplified block diagram illustrating a cross-sectional view of an integrated source and isolator device according to the present invention.

FIG. 4 is a simplified block diagram illustrating a cross-sectional view of an integrated source and isolator device 40 according to the present invention. A dotted line 46 represents a semiconductor substrate and other layers utilized to fabricate such a device. A detailed illustration of the various semiconductor layers is beyond the scope of the present application, and one of skill in the art knows that such a monolithically integrated device would comprise a number of layers requiring many fabrication steps.

Referring to FIG. 4, a DFB laser 41 and two modulators 42, 44 are monolithically integrated on a semiconductor substrate 46. In this embodiment, a light signal from a continuously operating, unmodulated DFB laser 41 is encoded with an RZ pulse pattern by modulator 42 as it travels in the direction of data transmission indicated by arrow 48. The two modulators 42, 44 are driven by drivers 43, 45 to function in the manner described above, and both can be driven by the data signal provided the timing sequence satisfies the expressions $T_d \geq T_g/2$ and $T_d \leq (T-T_g)/2$. The device 40 has immunity to external signals traveling in the reverse direction back towards the laser source 41, and also immunity to reflections from the end facet 47 of the device. Thus, the embodiment of FIG. 4 provides a stable, low frequency chirp RZ source device suitable for high-speed fiber-optic data transmission. For the purposes of this application, high-speed data transmission is defined as being a gigabit per second and higher.

The particular embodiment shown in FIG. 4 preferably employs electroabsorption modulators 42, 44 as the optical isolator and a DFB laser as the light source 41. The electroabsorption modulators provide low-loss transmission in a lower voltage "on" state, but provide high absorption and thus attenuation in a higher voltage "off" state. It should be understood that other modulators, such as directional coupler modulators, Mach-Zehnder modulators, waveguide cut-off modulators, or other interferometric modulators may also suitably be employed. In addition, a single driver may be used for both modulators as long as a phase delay is introduced to provide properly timed open and closed gates as explained above. Further, other laser sources such as DBR semiconductor lasers may suitably be used.

While FIGS. 1 to 4 illustrate a two modulator isolator device, more sophisticated modulator sequences using more than two modulators can readily be constructed.

Figure 5:
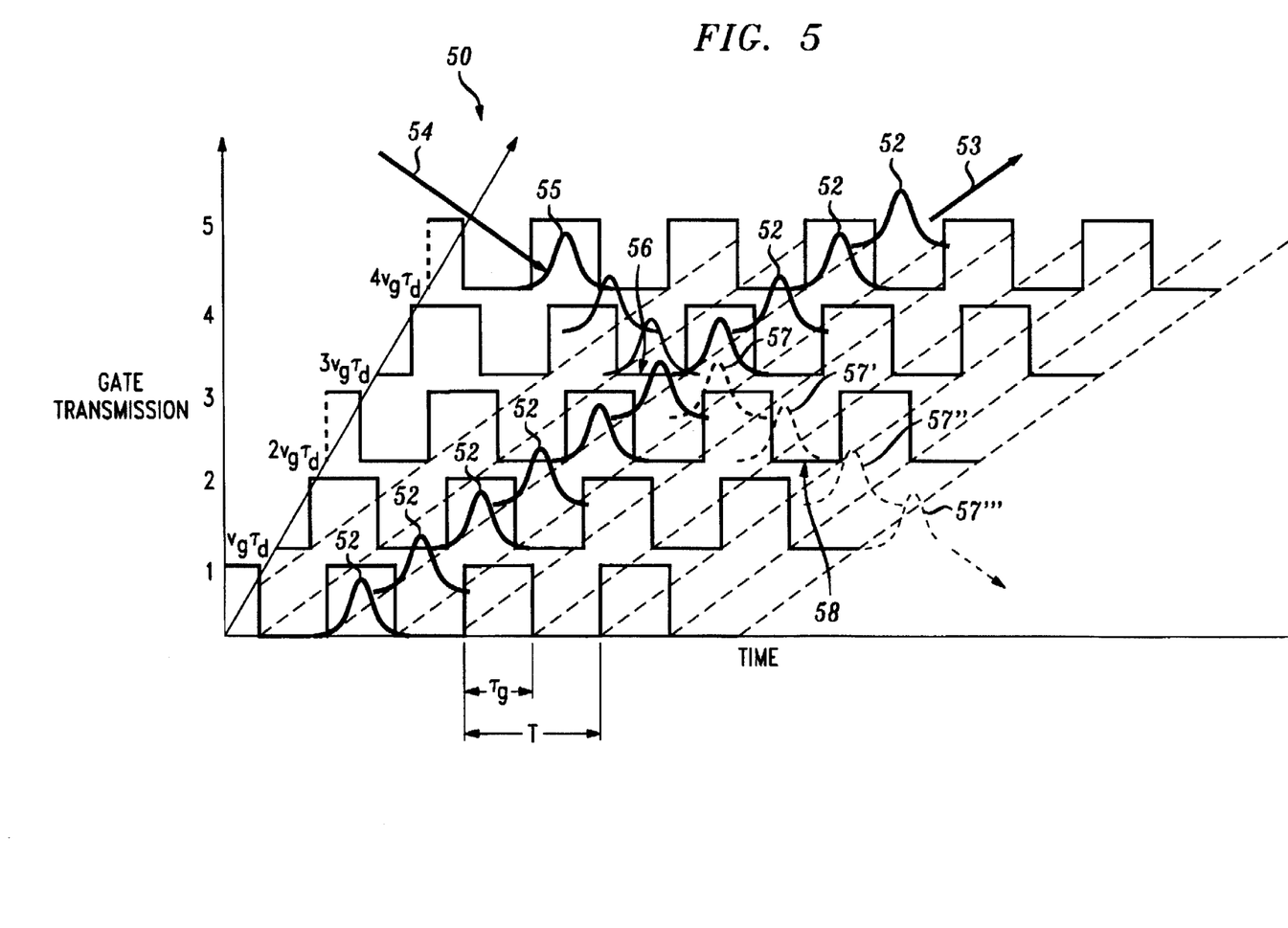
FIG. 5 is a timing diagram for an embodiment utilizing a plurality of modulators to form an isolator according to the present invention.

FIG. 5 is a timing diagram 50 illustrating how the present technique can be generalized so that many modulators with a spatial separation of $v_gT_d$ between each modulator can be utilized. FIG. 5 illustrates the sequence of open gates for five modulators having a duration $T_g$ and period T. The period of the RZ pulse 52 is equal to the period T of the modulator gates, and the duration of a pulse in the data stream $T_p$ is less than the duration $T_g$ of an open gate. The phase of the drive to each modulator is such that the modulator has an open gate of duration $T_g$ delayed in time from another modulator's open gate. This delay is the propagation delay $T_d$ between the modulators, and $T_d$ is a function of the spatial separation of the modulators from one another. Thus, the modulators are arranged sequentially in a line so that the timing of their open gates are synchronous with an RZ modulated data pulse stream to allow propagation through the modulators in the forward direction, indicated by arrow 53. Conversely, a signal travelling in the reverse direction 54 will encounter at least one modulator in the sequence which is in the "off" state or presenting a closed gate. It should be understood that, in practice, modulators have some spatial extent, which can add some propagation delay to the data signal as it passes through a modulator. Thus, when the modulators are sequentially arranged, this propagation delay must be included in the calculation of the net propagation delay between each modulator.

When a plurality of modulators form an isolator, it is not essential that all of the modulators satisfy the criterion $T_d \geq T_g/2$ and $T_d \leq (T-T_g)/2$, as long as at least two of the modulators comply. However, if each of the modulators in the sequence does satisfy the expressions $T_d \geq T_g/2$ and $T_d \leq (T-T_g)/2$, wherein $T_d$ represents the delay from the preceding modulator, then a signal traveling in the reverse direction will be made to experience more than one closed gate, or modulator in its off state.

Referring to FIG. 5, a signal 55 traveling in the reverse direction 54 will be attenuated when all or part of the signal encounters a closed gate. Thus, reverse direction signal 55 is attenuated by closed gate 56 generated by the fourth modulator, and is further attenuated by closed gate 58 generated by the third modulator. This phenomenon is illustrated by dotted lines 57, 57', 57" and 57"' which become lighter to represent diminishment of the reverse direction signal. Thus, when more than one closed gate is encountered higher isolation is achieved, resulting in improved performance.

Figure 5A:
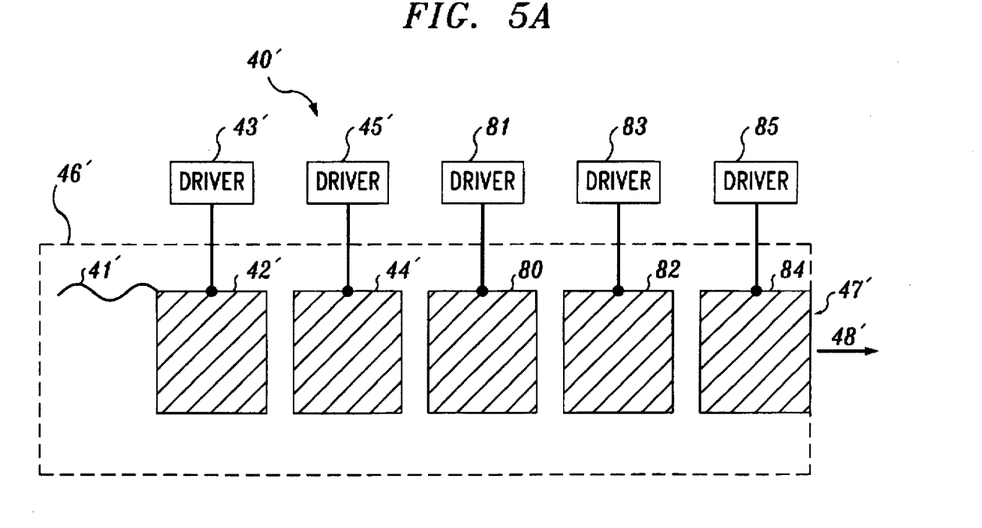
FIG. 5A illustrated an embodiment of the present invention utilizing plurality of modulators.

The above timing diagram examples illustrate isolation of an RZ data bit stream that is already encoded. However, the first modulator in the sequence can provide the means for encoding the light source signal with an RZ signal. Since the modulator must be in the "on" state for transmission of the data pulses, if there is no pulse to be transmitted during a particular bit period T (i.e., a "zero" in a string of "ones" and "zeros"), then the modulator will be off for a full cycle, and thus still provide isolation during the required part of the timing cycle. Thus, it is possible for a modulator to encode the data signal on an unmodulated light beam if the modulator is driven with the RZ data signal. In fact, each modulator in the isolator sequence can be driven with the RZ data signal as long as the appropriate time delays are maintained between the modulator drive signals. FIG. 5A shows a five modulator embodiment 40' of the present invention consistent with the timing of FIG. 5. In this embodiment, a plurality of additional modulators 80, 82, 84 are driven by drives 81, 83 and 85 respectively to be synchronous with the transmitted data stream and are arranged sequentially with first and second modulators 42' and 44' similar in operation to modulators 42 and 44 of FIG. 4. Other components of FIG. 5A are numbered similarly to those in FIG. 4 and operate similarly.

In some high-speed fiber optic data transmission devices, the end facet of the device produces reflections which cause frequency chirp problems. Several attempts to overcome the frequency chirp problem have failed because available facet anti-reflection coatings are inadequate. The embodiment of FIG. 6, discussed below, specifically addresses this problem.

Figure 6:
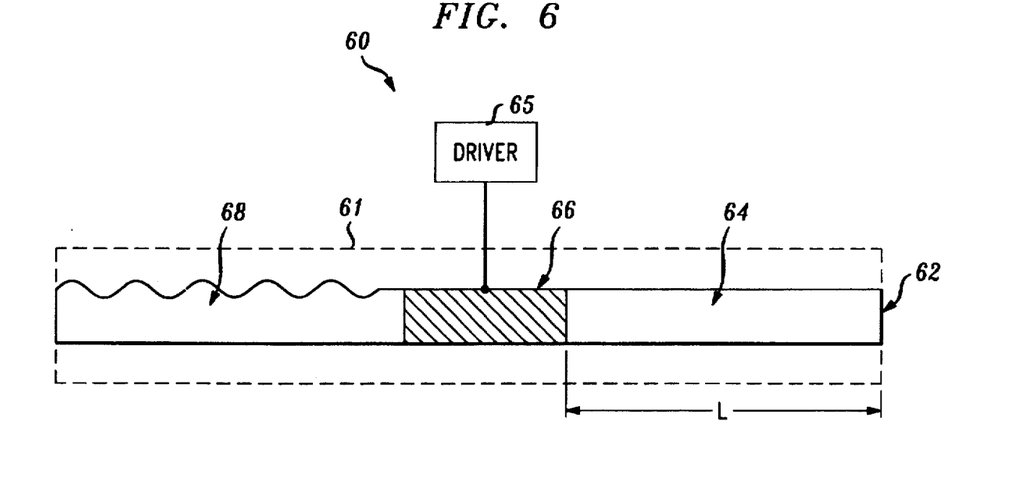
FIG. 6 is a simplified block diagram illustrating a cross-sectional view of an integrated source and isolator device according to another embodiment of the present invention.

FIG. 6 is a simplified schematic diagram illustrating a cross-sectional view of a monolithically integrated isolator 60 for reducing the frequency chirp problem caused by reflections from the end facet 62. A dotted line 61 represents a semiconductor substrate and other layers utilized to fabricate such a device. A detailed illustration of the various semiconductor layers is beyond the scope of the invention, and one of skill in the art knows that such a monolithically integrated device comprises a number of layers requiring many fabrication steps.

Referring to FIG. 6, a passive waveguide 64 has a length L and is integrated with an electroabsorption modulator 66 and a DFB laser 68. The modulator 66 is connected to a driver 65, and is driven to be synchronous with an RZ modulated data stream. The passive waveguide 64 functions as an optical delay line for light reflected from the end facet 62. In particular, the length L of the passive waveguide 64 provides a round-trip propagation delay time for the reflected light that is one-half a modulation bit period, or an odd-number multiple thereof. The length of passive waveguide 64 thus should be $L=Nv_g/(4B)$, where N is an odd integer, $v_g$ is the group velocity of an RZ signal in the passive waveguide and B is the bit rate. For a monolithically integrated device, a short delay line having N=1 is desirable.

Figure 7:
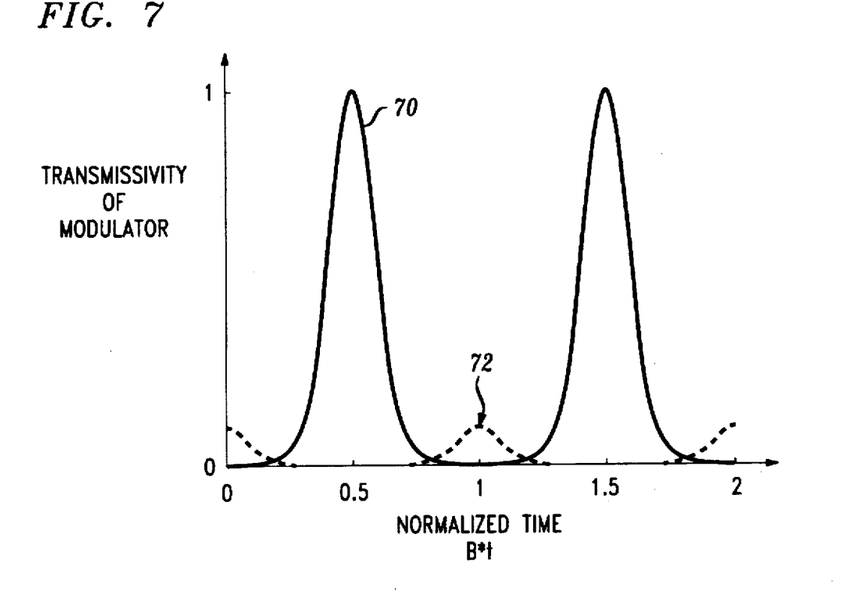
FIG. 7 graphically illustrates the transmissivity of the modulator of FIG. 6 and the reflected light intensity as a function of time.

FIG. 7 depicts the transmissivity 70 of the modulator 66 of FIG. 6, and the reflected light intensity represented as dotted line 72, as a function of time. If the length of the passive waveguide 64 is correctly chosen, then the modulator is in the "off" state when the reflected light 72 from the end facet 62 impinges on the modulator 66. Consequently, the reflected light signal 72 is attenuated and is not coupled into the DFB laser 68.

It is important to recognize that the frequency chirp induced by reflections from the end facet 62 is proportional to the reflectivity $R_o$ of the end facet. Thus, the modulator 66 is used to effectively reduce the reflectivity of the end facet 62, as explained below.

The transmissivity of an electroabsorption modulator as a function of applied voltage V(t) can be characterized by the exponential function $T(V(t))=\exp\{-0.23\times n\ V(t)/V_{pp}\}$, where $V_{pp}$ is the peak to peak applied voltage and n is the extinction ratio in decibels. The extinction ratio is defined as the on/off intensity ratio of the transmitted light pulses, and a large extinction ratio is desirable because if the signal has such a characteristic it is then easier to accurately decode the transmitted data. An extinction ratio of more than 30 dB has been experimentally obtained for electroabsorption modulators.

For example, for an RZ data stream the effective reflectivity $R_{ef}$ can be defined as the amount of reflected light coupled into the source laser, which is averaged over one modulation period. Thus, the reduction ratio is $R_{ef}/R_o=\int T(V(t))\times T(V(t-t_d))dt$, where $R_o$ is the power reflectivity of the end facet, and $t_d$ is the propagation delay time provided by the passive waveguide, which is: $t_d=2L/v_g$.

Assuming that the applied voltage is described by the simple sinusoidal function $V(t)=V_{pp}\{1+\cos(2\pi Bt)\}/2$, then, from the above equations, the relationship between the effective reflectivity and the length of the passive waveguide can be obtained.

Figure 8:
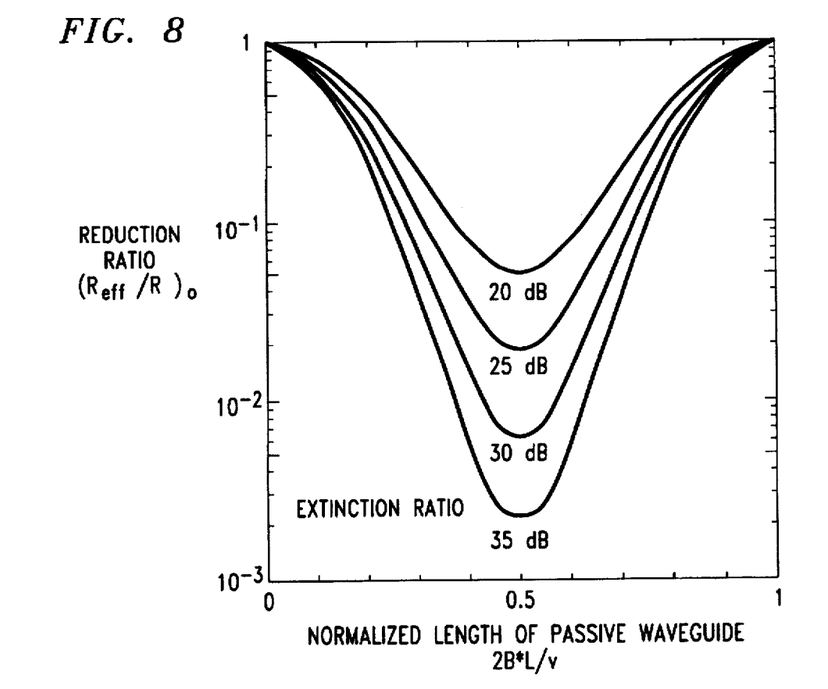
FIG. 8 graphically illustrates the effective reflectivity of the end facet of the device of FIG. 6 as a function of passive waveguide length for different extinction ratios.

FIG. 8 graphically illustrates the effective reflectivity of the end facet 62 as a function of passive waveguide length for different extinction ratios. As shown, when the passive waveguide 64 provides a delay time of one-half a modulation bit period (or an odd-number multiple thereof), the effective reflectivity is dramatically reduced. For example, the effective reflectivity is reduced by a factor of more than 150 when the extinction ratio is 30 dB. The length of the delay line is dependent on the bit rate. For example, for a 10 Gigabit per second RZ modulated signal, the length L of the passive waveguide should be approximately 2 mm. In addition, if a low-loss semiconductor passive waveguide is used, then insertion losses should be negligible.

Use of a passive waveguide in the manner described above may also be helpful for reducing the reflection-induced frequency chirp problem when other types of modulators and laser sources, such as Mach-Zehnder modulators and DBR lasers, are utilized.

The apparatus and methods disclosed herein provide for isolation of a source against signals traveling in the reverse direction that may impair its performance. By monolithically integrating two or more modulators with a light source, a device can be realized which isolates against light signals from external sources, as well as from reflections. By integrating a single modulator and a passive waveguide, a device can be realized that isolates against reflections of the light source from a known point, such as the end facet. Calculations show that the effective reflectivity in this case can be reduced by a factor of more than 150 when the extinction ratio is 30 dB for a transmission system using an RZ modulation signal.

Thus, the present invention dramatically relaxes the requirements on anti-reflection coatings at an end facet, and further enables a booster semiconductor amplifier to be integrated into a laser source and modulator device without significant increase in the frequency chirp. Further, the proposed concept could be extended to reduce optical feedback due to reflections in large scale photonic integrated circuits.

It should be understood that the above described arrangements are only examples of embodiments of the invention.

It will be apparent to those of skill in the art that various changes may be made without departing from the spirit and scope of the invention.

We claim:

1. A monolithically integrated signal source and isolator apparatus for providing a stable, low frequency chirp source device for high-speed fiber-optic data transmission, comprising:

a laser light source utilized as the signal source;

a first modulator driven to be synchronous with a transmitted data stream from the signal source;

a second modulator driven to be synchronous with the transmitted data stream, wherein the second modulator is sequentially arranged and spaced a distance apart from the first modulator to provide a phase delay between them, and wherein the modulators generate a timed sequence of open gates which permit transmission of a data signal in a forward direction and attenuate a reverse direction signal; and a semiconductor substrate, with the laser light source and the first and second modulators monolithically integrated on the semiconductor substrate.

2. The apparatus of claim 1, further comprising:

one or more additional modulators driven to be synchronous with the transmitted data stream arranged sequentially with the first and second modulators and monolithically integrated on the semiconductor substrate.

3. The apparatus of claim 2, wherein the plurality of modulators are each spaced apart from one another such that a reverse direction signal is attenuated by two or more modulators.

4. The apparatus of claim 1, wherein said distance that the second modulator is spaced apart from the first modulator provides a phase delay substantially equal to a propogation delay between the first and second modulators for the transmitted data stream as it travels from the first modulator to the second modulator.

5. The apparatus of claim 1, wherein high-speed optical fiber data transmission comprises data transmission at rates of one gigabit per second or higher.

6. The apparatus of claim 1, wherein said distance apart, $L=v_gT_d$, where $v_g$ is defined as the velocity of propogation of the transmitted data stream from the first modulator to the second modulator and $T_d$ is defined as the time delay or the time which it takes the data stream to travel from the first modulator to the second modulator.

7. The apparatus of claim 1, wherein said open gates are open for a first time duration, $T_g$, the period of the transmittal data stream is a second time duration, T, and $T_g/2<T_d<(T-T_g)/2$.

8. The apparatus of claim 1, wherein said transmitted data stream comprises a return to zero ("RZ") modulated data pulse stream and said open gates are synchronous with the RZ modulated data pulse stream.

9. A monolithically integrated signal source and isolator apparatus for the high speed fiber-optic transmission of data, comprising:

an unmodulated signal source;

a first modulator connected to the source for encoding the source signal to generate an RZ modulated data signal;

a second modulator sequentially connected to, and spaced apart from, the first modulator to provide a phase delay between them, wherein the modulators generate a timed sequence of open gates which permit a data stream to be transmitted in a forward direction, and attenuate a reverse direction signal; and a semiconductor substrate, with the unmodulated laser signal source and the first and second modulators monolithically integrated on the semiconductor substrate.

10. The apparatus of claim 9, further comprising:

one or more additional modulators driven to by synchronous with the transmitted data stream arranged sequentially with the first and second modulators and monolithically integrated on the semiconductor substrate.

11. The apparatus of claim 10, wherein the plurality of modulators are spaced apart from one another such that a reverse direction signal is attenuated by two or more modulators.

12. A monolithically integrated apparatus for the high-speed fiber-optic transmission of data comprising:

a source means for transmitting an RZ modulated signal;

a first modulator means connected to the source means, driven to be synchronous with the RZ signal;

a second modulator means sequentially connected to the first modulator means, driven to be synchronous with the RZ signal, wherein the second modulator means is spaced apart from the first modulator means to provide a phase delay between them such that the first and second modulator means generate a timed sequence of open gates which permit data transmission in a forward direction, and attenuate a reverse direction signal; and a semiconductor substrate, with the source means and the first and second modulator means monolithically integrated on the semiconductor substrate.

13. The apparatus of claim 12, further comprising:

one or more additional modulator means connected to the second modulator means, driven to be synchronous with the RZ signal, wherein the plurality of modulator means are sequentially arranged and spaced apart to generate a timed sequence of open gates, and monolithically integrated on the semiconductor substrate.

14. The apparatus of claim 13, wherein at least two modulator means attenuate a reverse direction signal.

15. The apparatus of claim 12, wherein the source means is a DFB laser.

16. The apparatus of claim 12, wherein the source means is a DBR laser.

17. The apparatus of claim 12, wherein the modulator means are electroabsorption modulators.

18. A monolithically integrated apparatus for the high speed fiber-optic transmission of data, comprising:

an unmodulated source means for providing a light signal;

a first modulator means connected to the source means driven to encode the light signal to generate an RZ modulated data signal;

a second modulator means sequentially connected to the first modulator means, driven to be synchronous with the RZ data signal, wherein the second modulator means is spaced apart from the first modulator means to provide a phase delay between them such that the first and second modulator means generate a timed sequence of open gates that permit data transmission in a forward direction and attenuate a reverse direction signal; and a semiconductor substrate, with the unmodulated source means and the first and second modulator means monolithically integrated on the semiconductor substrate.

19. The apparatus of claim 18, further comprising:

one or more modulator means sequentially connected to the second modulator means, driven to by synchronous with the RZ signal, and spaced apart to generate a timed sequence of open gates, and monolithically integrated on the semiconductor substrate.

20. The apparatus of claim 19, wherein at least two modulator means attenuate a reverse direction signal.

21. The apparatus of claim 18, wherein the source means is a DFB semiconductor laser.

22. The apparatus of claim 18, wherein the source means is a DBR semiconductor laser.

23. The apparatus of claim 18, wherein the modulator means are electroabsorption modulators.

24. A method for providing isolation for a stable, low frequency chirp signal source for high speed fiber-optic data transmission, comprising:

connecting a first and a second modulator to said signal source while monolithically integrating the first and second modulators and said signal source on a semiconductor substrate;

sequentially spacing the second modulator at a distance from the first modulator to provide a predetermined time delay;

driving the first modulator to be synchronous with a transmitted data signal from the signal source to produce a first sequence of open gates;

driving the second modulator to be synchronous with the transmitted data signal to produce a second sequence of open gates, wherein the second sequence of open gates is delayed in time from the first sequence of open gates;

transmitting data signals in a forward direction through the open gates of the first and second modulators; and attenuating a reverse direction signal.

25. The method of claim 24, wherein the first and second modulators are spaced apart to provide a time delay between them of a duration greater or equal to one-half of the duration of an open gate, and less than or equal to one-half of the time period consisting of the data signal duration minus the duration of an open gate.

26. The method of claim 24, further comprising:

connecting one or more additional sequentially arranged modulators to the second modulator and monolithically integrating said additional modulators on the semiconductor substrate;

driving the one or more additional modulators to be synchronous with the transmitted data signal from the signal source, wherein the first, second and additional modulators produce a sequence of open gates; and transmitting data signals through the open gates.

27. The method of claim 26, wherein at least one of the additional modulators is spaced a distance apart from another to provide a time delay of duration greater than or equal to one-half of the duration of an open gate, and less than or equal to one-half of the time period consisting of the data signal duration minus the duration of an open gate.

28. A method for providing isolation for a device containing a signal source and a plurality of sequentially arranged modulators, comprising:

monolithically integrating the signal source and the plurality of sequentially arranged modulators on a semiconductor substrate;

generating a signal with the signal source;

driving a first modulator of the plurality of modulators to encode the signal to produce an encoded data signal;

driving each of the other modulators to generate a timed sequence of open gates that are synchronous with the encoded data signal; and arranging the modulators to have a spatial separation to realize a sequence of timed open gates having a phase delay between them, wherein transmission of the encoded data signal is permitted in a forward direction and a reverse direction signal is attenuated.

29. The method of claim 28, wherein the time delay between each of the plurality of modulators is of a duration greater than or equal to one-half of the duration of an open gate, and is less than or equal to one-half of the period consisting of the encoded data signal duration minus the open gate duration.

30. A method for providing isolation for an apparatus containing a laser source and a plurality of sequentially arranged modulators, comprising:

monolithically integrating the laser source and the plurality of sequentially arranged modulators on a semiconductor substrate;

transmitting an RZ modulated data signal;

driving each modulator to generate a timed sequence of open gates that are synchronous with the RZ signal; and     arranging at least two of the modulators to have a spatial separation which provides a time delay between them that is greater or equal to one-half the duration of the open gate and less than or equal to one-half of the time period consisting of the RZ duration signal minus the duration of an open gate, wherein transmission in a forward direction is permitted and a reverse direction signal is attenuated.

31. The method of claim 30, wherein each modulator is driven to have a period identical to that of the RZ data signal.

32. A method for providing isolation for an apparatus containing a light source and a plurality of sequentially arranged modulators, comprising:

monolithically integrating the light source and the plurality of sequentially arranged modulators on a semiconductor substrate;

generating a light signal with the light source;

driving a first modulator of the plurality of modulators to encode the light signal to produce an RZ modulated data signal;

driving each of the other modulators to generate a timed sequence of open gates that are synchronous with the RZ data signal; and     arranging the modulators to have a spatial separation to realize a sequence of timed open gates having a phase delay between them, wherein transmission of the RZ data stream is permitted in a forward direction and a reverse direction signal is attenuated.

33. The method of claim 32, wherein the time delay between each of the plurality of modulators is of a duration greater than or equal to one-half of the duration of an open gate, and is less than or equal to one-half of the period consisting of the data signal duration minus the open gate duration.

* * * * *